United States Patent
Henrici et al.

(10) Patent No.: US 10,067,194 B2
(45) Date of Patent: Sep. 4, 2018

(54) SENSOR DEVICE FOR AN ELECTROCHEMICAL ENERGY STORE, ELECTROCHEMICAL ENERGY STORE, METHOD FOR MANUFACTURING A SENSOR DEVICE FOR AN ELECTROCHEMICAL ENERGY STORE

(71) Applicant: ROBERT BOSCH GMBH, Stuttgart (DE)

(72) Inventors: Fabian Henrici, Stuttgart (DE); Mathias Bruendel, Stuttgart (DE); Jens Grimminger, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 242 days.

(21) Appl. No.: 14/391,662

(22) PCT Filed: Mar. 7, 2013

(86) PCT No.: PCT/EP2013/054637
§ 371 (c)(1),
(2) Date: Oct. 9, 2014

(87) PCT Pub. No.: WO2013/152905
PCT Pub. Date: Oct. 17, 2013

(65) Prior Publication Data
US 2015/0102821 A1    Apr. 16, 2015

(30) Foreign Application Priority Data

Apr. 12, 2012   (DE) .................. 10 2012 205 937

(51) Int. Cl.
*H01M 10/48* (2006.01)
*G01R 31/36* (2006.01)
*H01R 43/16* (2006.01)

(52) U.S. Cl.
CPC ..... *G01R 31/3644* (2013.01); *G01R 31/3627* (2013.01); *H01M 10/48* (2013.01);
(Continued)

(58) Field of Classification Search
CPC   G01R 31/3644; G01R 31/3627; H01R 43/16; H01M 10/48; H01M 10/486; Y10T 29/49117; Y10T 29/49204
(Continued)

(56) References Cited

U.S. PATENT DOCUMENTS 5,290,643 A * 3/1994 Chen ................. H02J 7/0091
320/150
5,327,784 A * 7/1994 Venkatesan ........... H01M 10/48
73/714

(Continued)

FOREIGN PATENT DOCUMENTS

| CN | 101248546 A | 8/2008 |
|---|---|---|
| DE | 20 2009 015 040 | 1/2010 |

OTHER PUBLICATIONS

International Search Report for PCT/EP2013/054637, dated Jul. 18, 2013.

*Primary Examiner* — Jonathan Dunlap
(74) *Attorney, Agent, or Firm* — Norton Rose Fulbright US LLP; Gerard Messina (57) ABSTRACT

A sensor device for contacting first and second contact points of an electrochemical energy store which are situated inside a housing of the electrochemical energy store includes: a first terminal contact for the electrically conductive connection of the sensor device to the first contact point, a first terminal material on a surface of the first terminal contact corresponding to at least a first contact material on a surface of the first contact point; and a second terminal contact for the electrically conductive connection of the sensor device to the second contact point, a second terminal
(Continued)

material on a surface of the second terminal contact corresponding to at least a second contact material on a surface of the second contact point.

22 Claims, 2 Drawing Sheets (52) U.S. Cl.
CPC ........... *H01R 43/16* (2013.01); *H01M 10/486* (2013.01); *Y10T 29/49117* (2015.01); *Y10T 29/49204* (2015.01)

(58) Field of Classification Search
USPC .............................. 429/90, 92; 320/134, 136
See application file for complete search history.

(56) References Cited

U.S. PATENT DOCUMENTS

| | | | | |
|---|---|---|---|---|
| 5,580,675 A * | 12/1996 | Rouhani | ............... | H01M 10/48 429/90 |
| 6,304,062 B1 * | 10/2001 | Batson | .................. | G01R 1/203 320/134 |
| 6,479,187 B1 * | 11/2002 | Takasaki | ............. | H01M 2/1072 429/157 |
| 6,524,732 B1 * | 2/2003 | Iwaizono | .............. | H01M 10/42 429/100 |
| 6,593,669 B1 * | 7/2003 | Lemaire | ............ | H01M 10/4257 307/43 |
| 6,759,152 B2 * | 7/2004 | Iwaizono | .............. | H01M 10/42 429/1 |
| 6,795,782 B2 * | 9/2004 | Bertness | ............ | G01R 31/3627 702/121 |
| 6,893,753 B2 * | 5/2005 | Iwaizono | .............. | H01M 10/42 429/100 |
| 8,154,298 B2 * | 4/2012 | Schimmel | .............. | G01R 1/203 324/426 |
| 8,319,499 B2 * | 11/2012 | Gronwald | .............. | G01R 1/203 324/430 |
| 8,329,324 B2 * | 12/2012 | Lee | ..................... | H01M 2/1077 429/121 |
| 8,808,885 B2 | 8/2014 | Lee et al. | | |
| 8,988,044 B2 * | 3/2015 | Park | .................... | H01M 2/0215 320/107 |
| 9,172,066 B2 * | 10/2015 | Hong | .................... | H01M 2/021 |
| 9,360,500 B2 * | 6/2016 | Schramme | .............. | G01R 1/203 |
| 2004/0212342 A1 * | 10/2004 | Batson | .................. | H02J 7/0047 320/107 |
| 2007/0054157 A1 | 3/2007 | Ryu et al. | | |
| 2009/0302804 A1 * | 12/2009 | Park | .................... | H01M 2/0215 320/128 |
| 2010/0201369 A1 * | 8/2010 | Gronwald | .............. | G01R 1/203 324/430 |
| 2011/0059342 A1 * | 3/2011 | Lee | ..................... | H01M 2/1077 429/93 |
| 2011/0076531 A1 | 3/2011 | Lee et al. | | |
| 2011/0111265 A1 * | 5/2011 | Jang | ....................... | H01M 2/30 429/7 |
| 2012/0070717 A1 * | 3/2012 | Harada | .................. | B82Y 30/00 429/156 |
| 2012/0088143 A1 * | 4/2012 | Lietz | ..................... | H01M 2/202 429/121 |
| 2014/0147728 A1 * | 5/2014 | Reitzle | .................. | F04D 25/082 429/158 |
| 2015/0226810 A1 * | 8/2015 | Elian | ........................ | H04Q 9/00 429/90 |

\* cited by examiner

SENSOR DEVICE FOR AN ELECTROCHEMICAL ENERGY STORE, ELECTROCHEMICAL ENERGY STORE, METHOD FOR MANUFACTURING A SENSOR DEVICE FOR AN ELECTROCHEMICAL ENERGY STORE

BACKGROUND OF THE INVENTION

1. Field of the Invention

The present invention relates to a sensor device for an electrochemical energy store, an electrochemical energy store, a method for manufacturing a sensor device for an electrochemical energy store, and a method for electrically contacting a sensor device of an electrochemical energy store.

2. Description of the Related Art

With ever-growing demand for alternative drive concepts, for example, in particular electric drives are entering the focus of consideration. In the automobile industry, for example, battery packets which are used generally include multiple modules, which may in turn be assembled from multiple lithium-ion cells, for example. One challenge in this case is in particular an effective battery management system, which may monitor the function of individual cells of the battery and control their charging operation. Furthermore, for example, defective cells may be shut down and/or bypassed and state messages about a charge state may be output. A sensor is required for this purpose, which may also be situated inside a cell. For contacting the sensor with the battery cell, a terminal metal plating of a sensor housing is generally identical on all contacts, notwithstanding the contact partner for the contacts to be established. Published German utility model document DE 20 2009 015 040 U1 describes a module and a system for an electrochemical battery cell, in particular a module for covering an electrochemical battery cell and a battery system.

BRIEF SUMMARY OF THE INVENTION

The present invention provides a sensor device for an electrochemical energy store, the sensor device being provided for contacting a first contact point of the electrochemical energy store, which is situated inside a housing of the electrochemical energy store, and a second contact point of the electrochemical energy store, which is situated inside the housing of the electrochemical energy store, the sensor device including the following features:

a first terminal contact for the electrically conductive connection of the sensor device to the first contact point, a first terminal material on a surface of the first terminal contact corresponding at least to a first contact material on a surface of the first contact point; and a second terminal contact for the electrically conductive connection of the sensor device to the second contact point, a second terminal material on a surface of the second terminal contact corresponding at least to a second contact material on a surface of the second contact point.

The electrochemical energy store may be a battery, a battery cell or galvanic cell, or the like, in particular in the form of a galvanic or electrochemical secondary cell, as a stand-alone unit or as a subunit of a so-called battery pack or the like, for example. The electrochemical energy store may be provided, for example, for a power tool, a piece of electrical equipment, an electric vehicle, a hybrid vehicle, or the like. The at least one first and/or second contact material may be situated at least on one surface of the particular contact point. The surface of the first and/or second contact point may have the at least one particular contact material and optionally at least one further material. The at least one first contact material may have in particular copper, silver, or aluminum and the at least one second contact material may have in particular copper, silver, or aluminum. Therefore, at least the particular contact material may be situated on a surface of the first and/or second contact point. An alloy or a mixture of the particular contact material with at least one further material may also be situated on a surface of the first and/or second contact point. The housing of the electrochemical energy store may be hermetically sealed. Electrode assemblies of an electrochemical reaction device, the contact points, and the sensor device may be receivable or be received or may be situatable or be situated inside the housing.

The sensor device may be designed to detect states or state variables in the interior of the electrochemical energy store or the battery cell. The sensor device may have the terminal contacts, a sensor housing, an electrical circuit, which is situated inside the sensor housing, and at least one sensor element. Such a sensor element may be designed, for example, to detect a working temperature of the electrochemical energy store, an internal pressure of the electrochemical energy store, or resulting reaction products in the electrochemical energy store. The sensor housing may have a material and additionally or alternatively a sheathing material, which is chemically resistant in the event of a contact with a medium, in particular an electrolyte, inside the electrochemical energy store. The material, which forms at least one external surface of the sensor housing, may therefore be chemically resistant in the event of a contact with a medium inside the electrochemical energy store. The electrical circuit may be designed to receive sensor data or measuring data from the at least one sensor element. The electrical circuit may also be designed to transmit the sensor data or measuring data by way of modulation via at least one of the terminal contacts (power line communication) to an external receiver, for example, a battery management system, for example, in the form of a sensor signal. Modulation and output or transmission of the sensor data may take place on a carrier frequency or as a modulation of a carrier frequency. The carrier frequency may be applied in this case as an electrical voltage or as an electrical current. The transmission of the sensor data may also be carried out by load modulation. The electrical circuit may optionally have a transmitting unit, which may be designed to modulate the sensor data in order to generate a sensor signal, and to output the sensor signal to at least one of the terminal contacts. The electrical circuit or the transmitting unit may be designed, during the modulation and output or transmission, to modulate and output or transmit the sensor data according to a pre-definable protocol. The electrical circuit may also be designed to receive and demodulate a signal from at least one of the terminal contacts. Alternatively, the electrical circuit may have a receiving unit, which may be designed to receive and demodulate a signal from at least one of the terminal contacts.

The terminal contacts may be situated outside the sensor housing of the sensor device. The first and/or second terminal materials may be situated at least on one surface of the particular terminal contact. The surface of the first and/or second terminal contact may have the at least one particular terminal material and optionally at least one further material. The at least one first terminal material and the at least one second terminal material may have in particular copper, silver, and/or aluminum. At least the particular terminal material may therefore be situated on a surface of the first and/or second terminal contact. An alloy or a mixture of the particular terminal material with at least one further material may also be situated on a surface of the first and/or second terminal contact.

The present invention furthermore provides an electrochemical energy store including the following features:
a housing, in which a first contact point of the electrochemical energy store and a second contact point of the electrochemical energy store are situated; and
an above-mentioned sensor device, the first terminal contact being electrically conductively connected to the first contact point, the second terminal contact being electrically connected to the second contact point.

An above-mentioned sensor device may advantageously be employed or used in conjunction with the electrochemical energy store. In particular, an above-mentioned sensor device may advantageously be employed or used in conjunction with the electrochemical energy store to detect sensor data with respect to at least one state variable of the electrochemical energy store internally in the cell, terminal points, at which the sensor device is connected to the electrochemical energy store, being protected from contact corrosion by advantageous design of the contact partner.

The present invention also provides a method for manufacturing a sensor device for an electrochemical energy store, the sensor device being provided for contacting a first contact point of the electrochemical energy store, which is situated inside a housing of the electrochemical energy store, and a second contact point of the electrochemical energy store, which is situated inside the housing of the electrochemical energy store, the method including the following steps:
forming a first terminal contact for the electrically conductive connection of the sensor device to the first contact point, so that a first terminal material on a surface of the first terminal contact at least corresponds to a first contact material on a surface of the first contact point; and
forming a second terminal contact for the electrically conductive connection of the sensor device to the second contact point, so that a second terminal material on a surface of the second terminal contact at least corresponds to a second contact material on a surface of the second contact point.

An advantageous, above-mentioned sensor device may advantageously be manufactured by carrying out the method.

The present invention furthermore provides a method for electrically contacting a sensor device in an electrochemical energy store, the method including the following steps:
providing a housing of the electrochemical energy store, a first contact point of the electrochemical energy store, which is situated inside the housing, a second contact point of the electrochemical energy store, which is situated inside the housing, and a sensor device having a first terminal contact and a second terminal contact, a first terminal material on a surface of the first terminal contact at least corresponding to a first contact material on a surface of the first contact point, a second terminal material on a surface of the second terminal contact at least corresponding to a second contact material on a surface of the second contact point; and
electrically conductively connecting the first terminal contact of the sensor device to the first contact point of the electrochemical energy store and electrically conductively connecting the second terminal contact of the sensor device to the second contact point of the electrochemical energy store to electrically contact the sensor device in the electrochemical energy store.

With the aid of the method, an above-mentioned sensor device may advantageously be electrically contacted in an above-mentioned electrochemical energy store. In this step of connection, the terminal contacts may be electrically conductively and mechanically connected to the contact points with the aid of the establishment of an integrally-joined and/or form-fitted connection. The sensor device may be fastened and contacted in the step of connecting by a suitable joining process, for example, laser welding or riveting, in such a way that in particular similar metals come into contact with one another at points accessible to corrosive media inside the electrochemical energy store.

According to specific embodiments of the present invention, in particular by suitable assembly and joining technology, contacts of a sensor housing of a sensor device which lead outward may be designed in such a way that a particular material of surfaces of the contacts corresponds to particular materials of the contact points to be joined in the battery cell. In particular, the sensor device may be fastened and contacted in relation to the electrochemical energy store in such a way that only similar or identical materials come into contact at points accessible to corrosive media. Therefore, in each case similar contact partners are connected to one another, to contact a sensor device inside a housing of a battery cell.

One advantage of the present invention is that the terminal contacts of the sensor device and the conductive contact points of the battery cell represent similar contact partners, so that formation of local elements or contact corrosion is avoided. Therefore, protection of the contacting areas from corrosion or formation of local elements is achieved by avoiding connections of dissimilar contact partners or in particular dissimilar metallic joining partners. In this case, the contacting areas or joints may be protected from exposure to corrosive media such as water, electrolytes, etc. Since an increased risk of corrosion exists due to the conductive electrolytes in the cell interior of the electrochemical energy store and the flow of even small electrical currents, for example, for measuring signals, the terminal contacts and also the sensor housing of the sensor device are designed for the purpose of withstanding corrosion or a chemical reaction. The contacting of the sensor device to the battery cell is conceived in such a way that no local elements may form due to the use of suitable material combinations or metal combinations for the contact partners and thus contact corrosion may be prevented. The use of such a sensor device in the cell interior of the electrochemical energy store may increase a reliability and lengthen the lifetime of the sensor device and in particular of the electrical contacting of the sensor device in relation to the electrochemical energy store.

According to one specific embodiment of the sensor device, the first terminal material on the surface of the first terminal contact may correspond to the second terminal material on the surface of the second terminal contact. In this case, therefore the at least one first contact material on the surface of the first contact point of the electrochemical energy store may correspond to the at least one second contact material on the surface of the second contact point of the electrochemical energy store. Such a specific embodiment offers the advantage that the electrical connection between the sensor device and the electrochemical energy store may be established in a simple and inexpensive way.

Alternatively, the first terminal material on the surface of the first terminal contact may differ from the second terminal material on the surface of the second terminal contact. In this case, therefore the at least one first contact material on the surface of the first contact point of the electrochemical energy store may differ from the at least one second contact material on the surface of the second contact point of the electrochemical energy store. Such a specific embodiment offers the advantage that the electrical connection between the sensor device and the electrochemical energy store may also be established in a reliable and corrosion-avoiding way in the case of contact points of the electrochemical energy store which have different compositions.

The first terminal contact may also have an exposed section of a carrier element of the sensor device. The first terminal material on the surface of the first terminal contact may correspond to a material of the carrier element. Additionally or alternatively, the second terminal contact may have an exposed section of the carrier element of the sensor device. The second terminal material on the surface of the second terminal contact may correspond to a material of the carrier element. The carrier element of the sensor device may have a so-called lead frame or the like. The carrier element may be formed, for example, from copper, aluminum, or the like. At least one section of the carrier element may be situated inside a sensor housing of the sensor device or may be housed with the aid of a sensor housing. The exposed sections of the carrier element may be situated outside a sensor housing of the sensor device. Such a specific embodiment offers the advantage that the electrical connection between the sensor device and the electrochemical energy store may be established in a simple and inexpensive way using a carrier element which is installed anyway.

Furthermore, the first terminal contact may have a section of a carrier element of the sensor device and a first coating layer. The first terminal material on the surface of the first terminal contact may correspond to a material of the first coating layer. Additionally or alternatively, the second terminal contact may have a section of the carrier element of the sensor device and a second coating layer. The second terminal material on the surface of the second terminal contact may correspond to a material of the second coating layer. The coating layers may be applied to sections of the carrier element situated outside the sensor housing. The coating layers may be formed, for example, from silver, copper, aluminum, or the like. Such a specific embodiment offers the advantage that the electrical connection between the sensor device and the electrochemical energy store may also be established in a simple, reliable, and corrosion-avoiding way with the aid of at least one of the coating layers in the case of contact points, which have differing compositions, of the electrochemical energy store.

According to one specific embodiment of the electrochemical energy store, the electrochemical energy store may have a first electrode assembly having a first current conductor and a second electrode assembly having a second current conductor. The first contact point of the electrochemical energy store may have a section of the first current conductor and the second contact point of the electrochemical energy store may have a section of the second current conductor. In this case, one of the electrode assemblies may represent a cathode of the electrochemical energy store and a further of the electrode assemblies may represent an anode of the electrochemical energy store. The contact points may therefore be formed on the current conductors. The current conductors of the electrode assemblies may be electrically conductively connected to external terminals of the electrochemical energy store. The first current conductor may contain a material which has the at least one first contact material. The second current conductor may contain a material which has the at least one second contact material. The current conductors may be formed from different materials or metals for the anode and cathode, for example, aluminum or copper. Such a specific embodiment offers the advantage that the sensor device may therefore be electrically connected directly to the current conductors installed in the electrochemical energy store, different materials of the current conductor being able to be considered on the sensor side in the case of the contacting. The sensor device may therefore be connected directly to current conductors, which possibly contain different materials, of the electrochemical energy store while avoiding contact corrosion.

According to one specific embodiment of the method for manufacturing, in at least one of the steps of forming, the terminal contact may be formed while using a section of a carrier element of the sensor device or while using a section of a carrier element of the sensor device and a coating layer. Thus, in at least one of the steps of forming, the terminal contact may be formed in the form of a section of a carrier element of the sensor device or in the form of a coating layer on a section of a carrier element of the sensor device. Such a specific embodiment offers the advantage that the electrical connection between the sensor device and the electrochemical energy store may be established, while using a carrier element which is installed anyway, in a simple, inexpensive, reliable, and corrosion-avoiding way, different contact materials of the contact points of the electrochemical energy store also advantageously being able to be taken into consideration with the aid of the coating layer. The sensor device is therefore also usable in manifold ways in consideration of a broad variety of types of electrochemical energy stores or contact materials.

The present invention will be explained in greater detail as an example on the basis of the appended drawings.

DETAILED DESCRIPTION OF THE INVENTION

In the following description of preferred exemplary embodiments of the present invention, identical or similar reference numerals are used for the elements which are shown in the various figures and act similarly, a repeated description of these elements being omitted.

Figure 1:
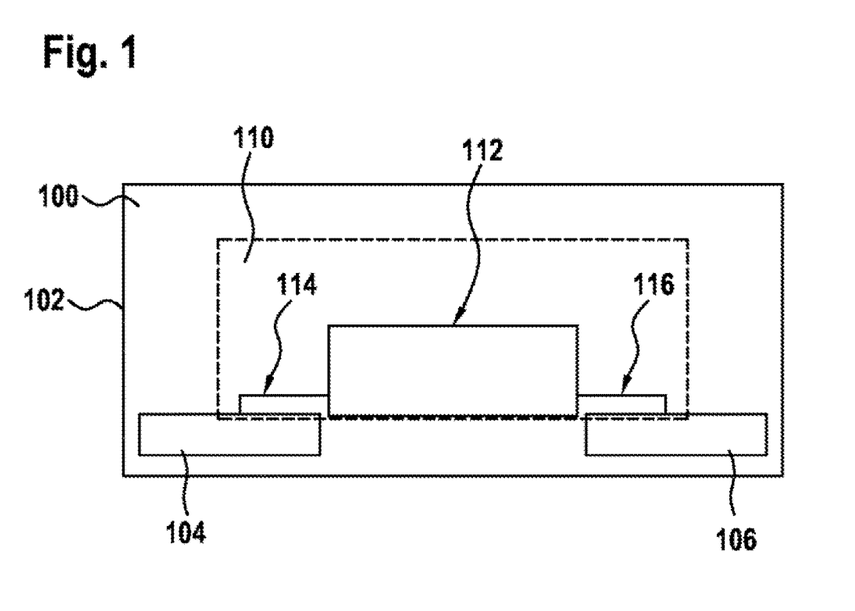
FIG. 1 shows a schematic view of an electrochemical energy store according to one exemplary embodiment of the present invention.

FIG. 1 shows a schematic view of an electrochemical energy store 100 according to one exemplary embodiment of the present invention. Electrochemical energy store 100, a housing 102, a first contact point 104 or first contact surface, a second contact point 106 or second contact surface, a sensor device 110, a sensor housing 112, a first terminal contact 114, and a second terminal contact 116 are shown. Electrochemical energy store 100 may be a lithium-ion cell, for example.

Electrochemical energy store 100 has housing 102, first contact point 104, and second contact point 106. First contact point 104 and second contact point 106 are situated inside housing 102. Electrochemical energy store 100 furthermore has sensor device 110. Sensor device 110 is situated inside housing 102 of electrochemical energy store 100. Sensor device 110 has sensor housing 112, first terminal contact 114, and second terminal contact 116. Sensor device 110 is electrically connected to first contact point 104 and second contact point 106 of electrochemical energy store 100. First terminal contact 114 is electrically connected to first contact point 104 and second terminal contact 116 is electrically connected to second contact point 106.

First contact point 104 and second contact point 106 of electrochemical energy store 100 are formed, for example, as sections of current conductors of electrode assemblies of electrochemical energy store 100, although this is not shown in the schematic view of FIG. 1. First contact point 104 and second contact point 106 have an electrically conductive contact material, in particular a metallic contact material. First contact point 104 has a first contact material and second contact point 106 has a second contact material. The first contact material may correspond to the second contact material or may differ therefrom. First contact point 104 and second contact point 106 of electrochemical energy store 100 are designed for the electrically conductive connection to first terminal contact 114 and second terminal contact 116 of sensor device 110.

First terminal contact 114 and second terminal contact 116 of sensor device 110 are formed, for example, as sections of a shared carrier element of sensor device 110, even if this is not explicitly shown in the schematic view of FIG. 1. First terminal contact 114 and second terminal contact 116 are situated outside sensor housing 112 of sensor device 110. First terminal contact 114 and second terminal contact 116 have an electrically conductive terminal material, in particular a metallic terminal material. First terminal contact 114 has a first terminal material and second terminal contact 116 has a second terminal material. The first terminal material may correspond to the second terminal material or may differ therefrom. First terminal contact 114 and second terminal contact 116 of sensor device 110 are designed for the electrically conductive connection to first contact point 104 and second contact point 106 of electrochemical energy store 100.

The first terminal material on a surface of first terminal contact 114 of sensor device 110 corresponds at least to the first contact material on a surface of first contact point 104 of electrochemical energy store 100. The second terminal material on a surface of second terminal contact 116 of sensor device 110 corresponds at least to the second contact material on a surface of second contact point 106 of electrochemical energy store 100. Terminal contacts 114 and 116 of sensor device 110 are electrically conductively and mechanically connected to contact points 104 and 106 of electrochemical energy store 100. Terminal contacts 114 and 116 of sensor device 110 are electrically conductively and mechanically connected to contact points 104 and 106 of electrochemical energy store 100, for example, with the aid of a joining connection, in particular with the aid of laser welding, riveting, or the like. Sensor device 110 is therefore electrically conductively and mechanically connected to electrochemical energy store 100. Thus, an electrical circuit (not shown in FIG. 1), which is situated inside sensor housing 102, of sensor device 110 may be electrically conductively connected via terminal contacts 114 and 116 of sensor device 110, contact points 104 and 106 of electrochemical energy store 100, and further electrical conductors of electrochemical energy store 100 to battery terminals of electrochemical energy store 100.

Figure 2:
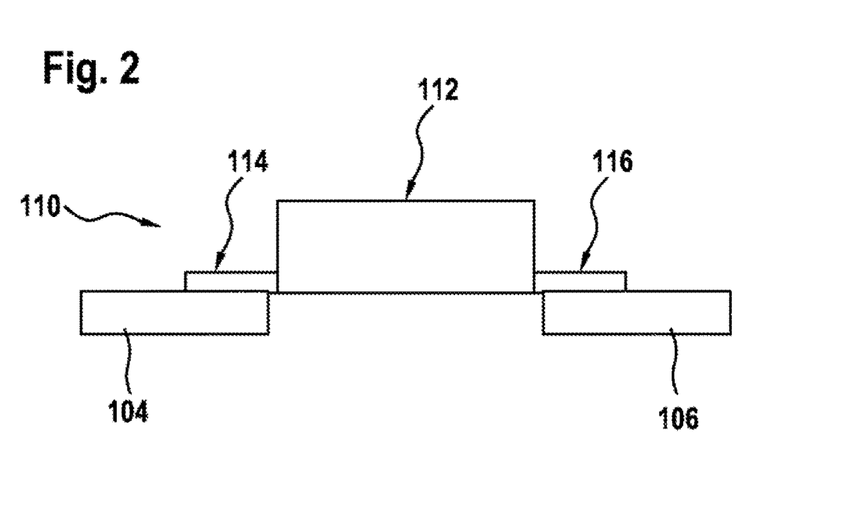
FIG. 2 shows a schematic view of a sensor device according to one exemplary embodiment of the present invention.

FIG. 2 shows a schematic view of a sensor device according to one exemplary embodiment of the present invention, the sensor device being connected at two contact points. A first contact point 104, a second contact point 106, sensor device 110, a sensor housing 112, a first terminal contact 114, and a second terminal contact 116 are shown. In other words, FIG. 2 shows a part of the electrochemical energy store from FIG. 1. Therefore, sensor device 110 in FIG. 2 may be the sensor device from FIG. 1. Contact points 104 and 106 in FIG. 2 may also be the contact points from FIG. 1. Therefore, the view in FIG. 2 corresponds to the view from FIG. 1, with the difference that the electrochemical energy store in FIG. 2 is shown without the housing.

Although it is not explicitly shown in FIG. 2, first terminal contact 114 of sensor device 110 has, for example, a first metal as the first terminal material. Therefore, the at least one first contact material of first contact point 104 may correspond to the first metal. Furthermore, second terminal contact 116 of sensor device 110 has, for example, a second metal, which may differ from the first metal, as the second terminal material. The at least one second contact material of second contact point 106 may therefore correspond to the second metal. According to the exemplary embodiment of the present invention shown in FIG. 2, terminal contacts 114 and 116 are formed from a solid material corresponding to a particular contact point 104 or 106.

Figure 3:
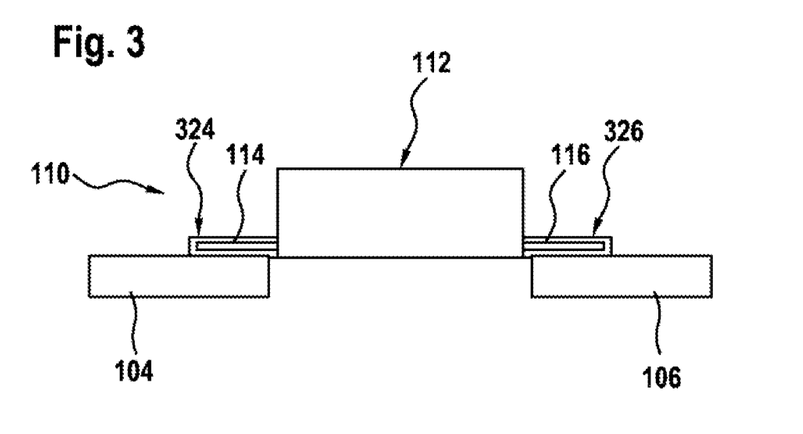
FIG. 3 shows a schematic view of a sensor device according to another exemplary embodiment of the present invention.

FIG. 3 shows a schematic view of a sensor device according to another exemplary embodiment of the present invention, the sensor device being connected to two contact points. A first contact point 104, a second contact point 106, sensor device 110, a sensor housing 112, a first terminal contact 114, a second terminal contact 116, a first coating layer 324, and a second coating layer 326 are shown. In other words, FIG. 3 shows a part of the electrochemical energy store from FIG. 1. Therefore, sensor device 110 in FIG. 3 may be the sensor device from FIG. 1 or FIG. 2, sensor device 110 in FIG. 3 additionally having coating layers 324 and 326. Contact points 104 and 106 in FIG. 3 may also be the contact points from FIG. 1 or FIG. 2. Therefore, the illustration in FIG. 3 corresponds to the illustration from FIG. 1, with the difference that the electrochemical energy store in FIG. 3 is shown without the housing and with coating layers 324 and 326. Furthermore, the illustration in FIG. 3 corresponds to the illustration from FIG. 2, with the difference that sensor device 110 in FIG. 3 additionally has coating layers 324 and 326.

Although it is not explicitly shown in FIG. 3, the first terminal material of first terminal contact 114 and the second terminal material of second terminal contact 116 have, for example, the same material as the carrier material or the same metal as the carrier metal for coating layers 324 and 326. First terminal contact 114 has first coating layer 324. First coating layer 324 is applied to first terminal contact 114 of sensor device 110. First coating layer 324 therefore forms a surface of first terminal contact 114. Second terminal contact 116 has second coating layer 326. Second coating layer 326 is applied to second terminal contact 116 of sensor device 110. Second coating layer 326 therefore forms a surface of second terminal contact 116.

In particular, first coating layer 324 has a first metal as the first terminal material. In this case, the at least one first contact material of first contact point 104 may correspond to the first metal. Furthermore, second coating layer 326 has, for example, a second metal, which may differ from the first metal, as the second terminal material. Therefore, the at least one second contact material of second contact point 106 may correspond to the second metal. According to the exemplary embodiment of the present invention shown in FIG. 3, terminal contacts 114 and 116 are formed from a metallic carrier material, for example, copper, whose surfaces are provided or coated with coating layers 324 and 326 in the form of terminal metal platings of different metals or coatings corresponding to particular contact point 104 or 106. According to another exemplary embodiment of the present invention, only one of terminal contacts 114 or 116 may also be provided with a coating layer 324 or 326, respectively, for example, silver or aluminum, the other of terminal contacts 114 or 116 being able to have a solid material of the carrier metal, for example, copper, as the surface.

Figure 4:
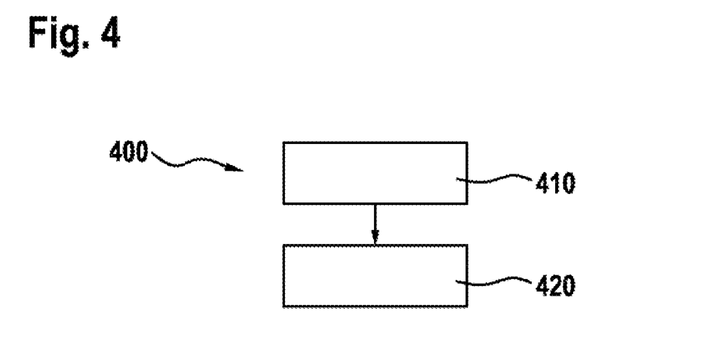
FIG. 4 shows a flow chart of a method for manufacturing according to one exemplary embodiment of the present invention.

FIG. 4 shows a flow chart of a method 400 for manufacturing a sensor device for an electrochemical energy store, according to one exemplary embodiment of the present invention. The sensor device is provided for contacting a first contact point of the electrochemical energy store, which is situated inside a housing of the electrochemical energy store, and a second contact point of the electrochemical energy store, which is situated inside the housing of the electrochemical energy store. Method 400 has a step of forming 410 a first terminal contact for the electrically conductive connection of the sensor device to the first contact point, so that a first terminal material on a surface of the first terminal contact at least corresponds to a first contact material on a surface of the first contact point. Method 400 also has a step of forming 420 a second terminal contact for the electrically conductive connection of the sensor device to the second contact point, so that a second terminal material on a surface of the second terminal contact at least corresponds to a second contact material on a surface of the second contact point. The step of forming 410 the first terminal contact may be carried out before, after, or together with the step of forming 420 the second terminal contact. The sensor device from one of FIGS. 1 through 3 may advantageously be manufactured by carrying out method 400.

Figure 5:
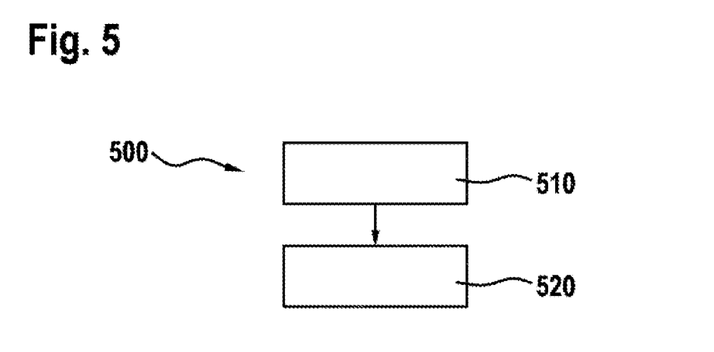
FIG. 5 shows a flow chart of a method for electrical contacting according to one exemplary embodiment of the present invention.

FIG. 5 shows a flow chart of a method 500 for electrically contacting a sensor device in an electrochemical energy store, according to one exemplary embodiment of the present invention. Method 500 has a step of providing 510 a housing of the electrochemical energy store, a first contact point of the electrochemical energy store, which is situated inside the housing, a second contact point of the electrochemical energy store, which is situated inside the housing, and a sensor device having a first terminal contact and a second terminal contact. In the step of providing 510, a sensor device is provided, in which a first terminal material on a surface of the first terminal contact corresponds at least to a first contact material on a surface of the first contact point of the electrochemical energy store. In this case, a second terminal material on a surface of the second terminal contact also corresponds at least to a second contact material on a surface of the second contact point. Method 500 also has a step of electrically conductively connecting 520 the first terminal contact of the sensor device to the first contact point of the electrochemical energy store and electrically conductively connecting the second terminal contact of the sensor device to the second contact point of the electrochemical energy store. With the aid of method 500, the sensor device, which is manufactured with the aid of the method from FIG. 4, for example, from one of FIGS. 1 through 3, may advantageously be electrically contacted in the electrochemical energy store from FIG. 1.

With reference to FIGS. 1 through 5, the underlying concept of the various exemplary embodiments of the present invention will be summarized once again in other words. Exemplary embodiments of the present invention relate to a sensor device 110 having a sensor housing 112 for installation in a battery cell or an electrochemical energy store 100. Components of an electrical circuit of sensor device 110 inside sensor housing 112 are protected by a suitable passivation or sheathing of their contact surfaces from corrosion, which could be caused, for example, by an electrolyte of electrochemical energy store 100. A main feature of exemplary embodiments of the present invention is therefore the connection of the sensor housing or sensor device 110 to the battery cell or electrochemical energy store 100.

A structural form according to one exemplary embodiment of the present invention relates to a sensor housing 112 having terminal contacts 114 and 116 in the form of metallic contacts to the outside. These terminal contacts 114 and 116 are frequently implemented on the basis of a copper terminal frame or copper lead frame and are provided with suitable terminus metal platings or coating layers 324 and 326. By way of a suitable assembly and joining technology as per methods according to exemplary embodiments of the present invention, it is possible to design the outwardly leading terminal contacts 114 and 116 of sensor housing 112 in such a way that at least their surface material corresponds to the material of particular contact point 104 or 106 to be joined.

Sensor housing 112 may be, for example, a modified lead-frame-based housing, which is completely or partially extrusion coated using a sheathing compound. At least one of terminal contacts 114 and 116 may either only have an exposed section of the corresponding solid material of the terminal frame, for example, copper or aluminum, or may have a metallic carrier material, for example, copper, whose surface is provided with possibly differing terminus metal platings. By way of a suitable joining process, for example, laser welding or riveting, sensor device 110 may be fastened and contacted on electrochemical energy store 100 in such a way that only similar metals come into contact as pairs of contact material and terminal material at points accessible to corrosive media.

The exemplary embodiments described and shown in the figures are only selected as examples. Different exemplary embodiments may be combined with one another in their entirety or with respect to individual features. One exemplary embodiment may also be supplemented by features of another exemplary embodiment. Furthermore, method steps according to the present invention may be repeated and also carried out in a sequence different from the described sequence.

What is claimed is:

1. A sensor device for an electrochemical energy store, the sensor device comprising:
   a sensor housing;
   an electrical circuit and at least one sensor element disposed inside the sensor housing;
   a shared carrier element formed from an electrically conductive material, the shared carrier element having:
     at least one section disposed inside the sensor housing,
     a first exposed section disposed outside the sensor housing on one end of the at least one section of the shared carrier element, and a second exposed section disposed outside the sensor housing on an opposing end of the at least one section of the shared carrier element;
a first terminal contact comprising the first exposed section of the shared carrier element for providing an electrically conductive connection of the sensor device to a first contact point of the electrochemical energy store, where a first terminal material on a surface of the first terminal contact is the same material as at least a first contact material on a surface of the first contact point; and
a second terminal contact comprising the second exposed section of the shared carrier element for providing an electrically conductive connection of the sensor device to a second contact point of the electrochemical energy store, where a second terminal material on a surface of the second terminal contact is the same material as at least a second contact material on a surface of the second contact point,
wherein the sensor device is configured to contact the first contact point and the second contact point of the electrochemical energy store which are situated inside a housing of the electrochemical energy store, and
wherein the shared carrier element includes a lead frame formed of the electrically conductive material, and wherein the first exposed section is a first exposed section of the lead frame, and the second exposed section is a second exposed section of the lead frame.

2. The sensor device as recited in claim 1, wherein the first terminal material on the surface of the first terminal contact is the same material as the second terminal material on the surface of the second terminal contact.

3. The sensor device as recited in claim 1, wherein the first terminal material on the surface of the first terminal contact differs from the second terminal material on the surface of the second terminal.

4. The sensor device as recited in claim 1, wherein at least one of:
the first terminal material on the surface of the first terminal contact is the same material as a material of the carrier element; and
the second terminal material on the surface of the second terminal contact is the same material as a material of the carrier element.

5. The sensor device as recited in claim 1, wherein at least one of:
the first terminal contact has a first coating layer, where the first terminal material on the surface of the first terminal contact is the same material as a material of the first coating layer; and
the second terminal contact has a second coating layer, where the second terminal material on the surface of the second terminal contact is the same material as a material of the second coating layer.

6. The sensor device as recited in claim 1, wherein at least one of:
the first terminal contact has a first coating layer, where the first terminal material on the surface of the first terminal contact is a different material as a material of the first coating layer; and
the second terminal contact has a second coating layer, where the second terminal material on the surface of the second terminal contact is a different material as a material of the second coating layer.

7. The sensor device as recited in claim 1, wherein the electrically conductive material is one of copper or aluminum.

8. An electrochemical energy store comprising:
a housing, in which a first contact point and a second contact point of the electrochemical energy store are situated; and
a sensor device configured for contacting the first contact point and the second contact point of the electrochemical energy store, the sensor device having:
a sensor housing;
an electrical circuit and at least one sensor element disposed inside the sensor housing;
a shared carrier element formed from an electrically conductive material, the shared carrier element having:
at least one section disposed inside the sensor housing,
a first exposed section disposed outside the sensor housing on one end of the at least one section of the shared carrier element, and
a second exposed section disposed outside the sensor housing on an opposing end of the at least one section of the shared carrier element;
a first terminal contact comprising the first exposed section of the shared carrier element that is electrically conductively connected to the first contact point, where a first terminal material on a surface of the first terminal contact is the same material as at least a first contact material on a surface of the first contact point; and
a second terminal contact comprising the second exposed section of the shared carrier element that is electrically conductively connected to the second contact point, where a second terminal material on a surface of the second terminal contact is the same material as at least a second contact material on a surface of the second contact point,
wherein the shared carrier element includes a lead frame formed of the electrically conductive material, and wherein the first exposed section is a first exposed section of the lead frame, and the second exposed section is a second exposed section of the lead frame.

9. The electrochemical energy store as recited in claim 8, further comprising:
a first electrode assembly having a first current conductor and a second electrode assembly having a second current conductor, the first contact point of the electrochemical energy store having a segment of the first current conductor and the second contact point of the electrochemical energy store having a segment of the second current conductor.

10. The electrochemical energy store as recited in claim 8, wherein the electrically conductive material is one of copper or aluminum.

11. A method for manufacturing a sensor device for an electrochemical energy store, the method comprising:
forming a sensor housing;
forming an electrical circuit and at least one sensor element disposed inside the sensor housing;
forming a shared carrier element from an electrically conductive material, the shared carrier element having:
at least one section disposed inside the sensor housing,
a first exposed section disposed outside the sensor housing on one end of the at least one section of the shared carrier element, and
a second exposed section disposed outside the sensor housing on an opposing end of the at least one section of the shared carrier element;

forming a first terminal contact comprising the first exposed section of the shared carrier element for providing an electrically conductive connection of the sensor device to a first contact point of the electrochemical energy store, wherein a first terminal material on a surface of the first terminal contact is the same material as at least a first contact material on a surface of the first contact point; and forming a second terminal contact comprising the second exposed section of the shared carrier element for providing an electrically conductive connection of the sensor device to a second contact point of the electrochemical energy store, wherein a second terminal material on a surface of the second terminal contact is the same material as at least a second contact material on a surface of the second contact point, wherein the sensor device is configured to contact the first contact point and the second contact point of the electrochemical energy store, which are situated inside the housing of the electrochemical energy store, and wherein the shared carrier element includes a lead frame formed of the electrically conductive material, and wherein the first exposed section is a first exposed section of the lead frame, and the second exposed section is a second exposed section of the lead frame.

12. The method as recited in claim 11, wherein at least one of the terminal contacts is formed by disposing a coating layer on a surface of the at least one of the terminal contacts.

13. The sensor device as recited in claim 12, wherein a terminal material on the surface of the at least one of the terminal contacts is the same material as a material of the coating layer.

14. The sensor device as recited in claim 12, wherein a terminal material on the surface of the at least one of the terminal contacts is a different material as a material of the coating layer.

15. The method as recited in claim 11, wherein the electrically conductive material is one of copper or aluminum.

16. A method for electrically contacting a sensor device in an electrochemical energy store, comprising:
   providing a housing of the electrochemical energy store, a first contact point and a second contact point of the electrochemical energy store being situated inside the housing, and a sensor device having:
      a sensor housing;
      an electrical circuit and at least one sensor element disposed inside the sensor housing;
      a shared carrier element formed from an electrically conductive material, the shared carrier element having:
         at least one section disposed inside the sensor housing,
         a first exposed section disposed outside the sensor housing on one end of the at least one section of the shared carrier element, and
         a second exposed section disposed outside the sensor housing on an opposing end of the at least one section of the shared carrier element;
      a first terminal contact comprising the first exposed section of the shared carrier element; and
      a second terminal contact comprising the second exposed section of the shared carrier element, where a first terminal material on a surface of the first terminal contact is the same material as at least a first contact material on a surface of the first contact point, and where a second terminal material on a surface of the second terminal contact is the same material as at least a second contact material on a surface of the second contact point, wherein the shared carrier element includes a lead frame formed of the electrically conductive material, and wherein the first exposed section is a first exposed section of the lead frame, and the second exposed section is a second exposed section of the lead frame; and electrically conductively connecting the first terminal contact of the sensor device to the first contact point of the electrochemical energy store, and electrically conductively connecting the second terminal contact of the sensor device to the second contact point of the electrochemical energy store, to electrically contact the sensor device in the electrochemical energy store.

17. The method as recited in claim 16, wherein the electrically conductive material is one of copper or aluminum.

18. A sensor device for an electrochemical energy store, the sensor device comprising:
   a sensor housing disposed between a first terminal contact of the sensor device and a second terminal contact of the sensor device;
   an electrical circuit and at least one sensor element disposed inside the sensor housing;
   a shared carrier element formed from an electrically conductive material, the shared carrier element having:
      at least one section disposed inside the sensor housing,
      a first exposed section disposed outside the sensor housing on one end of the at least one section of the shared carrier element, and
      a second exposed section disposed outside the sensor housing on an opposing end of the at least one section of the shared carrier element;
   the first terminal contact comprising the first exposed section of the shared carrier element for providing an electrically conductive connection of the sensor device to a first contact point of the electrochemical energy store, the first contact point situated inside an electrochemical energy store housing, where a material of the first terminal contact is the same as a material of the first contact point; and
   the second terminal contact comprising the second exposed section of the shared carrier element for providing an electrically conductive connection of the sensor device to a second contact point different from the first contact point of the electrochemical energy store, the second contact point situated inside an electrochemical energy store housing, where a material of the second terminal contact is the same as a material of the second contact point,
   wherein the shared carrier element includes a lead frame formed of the electrically conductive material, and wherein the first exposed section is a first exposed section of the lead frame, and the second exposed section is a second exposed section of the lead frame.

19. The sensor device as recited in claim 18, further comprising:
   a first coating layer disposed on a surface of the first terminal contact, where the first coating layer is the same material as the material of the first contact point; and
   a second coating layer different from the first coating layer disposed on a surface of the second terminal contact, where the second coating layer is the same material as the material of the second contact point.

20. The sensor device as recited in claim 18, wherein the electrically conductive material is one of copper or aluminum.

21. A sensor device for an electrochemical energy store, the sensor device comprising:
- a sensor housing;
- an electrical circuit and at least one sensor element disposed inside the sensor housing;
- a shared carrier element formed from an electrically conductive material, the shared carrier element having:
    - at least one section disposed inside the sensor housing,
    - a first exposed section disposed outside the sensor housing on one end of the at least one section of the shared carrier element, and
    - a second exposed section disposed outside the sensor housing on an opposing end of the at least one section of the shared carrier element;
- a first terminal contact comprising the first exposed section of the shared carrier element for providing an electrically conductive connection of the sensor device to a first contact point of the electrochemical energy store, where a first terminal material on a surface of the first terminal contact is the same material as at least a first contact material on a surface of the first contact point; and
- a second terminal contact comprising the second exposed section of the shared carrier element for providing an electrically conductive connection of the sensor device to a second contact point of the electrochemical energy store, where a second terminal material on a surface of the second terminal contact is the same material as at least a second contact material on a surface of the second contact point,
- wherein the sensor device is configured to contact the first contact point and the second contact point of the electrochemical energy store which are situated inside a housing of the electrochemical energy store, and
- wherein the electrical circuit is configured to receive data from the at least one sensor element and transmit the data via at least one of the first terminal contact and the second terminal contact to an external receiver.

22. The sensor device as recited in claim 21, wherein the electrically conductive material is one of copper or aluminum.

* * * * *